(12) United States Patent
Azadet et al.

(10) Patent No.: US 9,280,315 B2
(45) Date of Patent: Mar. 8, 2016

(54) VECTOR PROCESSOR HAVING INSTRUCTION SET WITH VECTOR CONVOLUTION FUNCTION FOR FIR FILTERING

(71) Applicant: Intel Corporation, Santa Clara, CA (US)

(72) Inventors: Kameran Azadet, Pasadena, CA (US); Meng-Lin Yu, Morganville, NJ (US); Joseph Othmer, Ocean, NJ (US); Joseph Williams, Ocean, NJ (US); Albert Molina, Novelda (ES)

(73) Assignee: Intel Corporation, Santa Clara, CA (US)

( * ) Notice: Subject to any disclaimer, the term of this patent is extended or adjusted under 35 U.S.C. 154(b) by 393 days.

(21) Appl. No.: 13/701,376

(22) PCT Filed: Oct. 26, 2012

(86) PCT No.: PCT/US2012/062182
§ 371 (c)(1),
(2) Date: Apr. 24, 2013

(87) PCT Pub. No.: WO2013/063440
PCT Pub. Date: May 2, 2013

(65) Prior Publication Data
US 2014/0108477 A1 Apr. 17, 2014

Related U.S. Application Data

(60) Provisional application No. 61/552,242, filed on Oct. 27, 2011.

(51) Int. Cl.
*G06F 17/15* (2006.01)
*G06F 5/01* (2006.01)
(Continued)

(52) U.S. Cl.
CPC ............... *G06F 5/01* (2013.01); *G06F 9/3001* (2013.01); *H03F 1/0288* (2013.01); *H03F 1/3241* (2013.01); *H03F 1/3258* (2013.01); *H03F 3/189* (2013.01); *H03F 3/24* (2013.01); *H03M 3/30* (2013.01); *H04B 1/0475* (2013.01); *H04B 1/62* (2013.01); *H04L 1/0054* (2013.01);
(Continued)

(58) Field of Classification Search
USPC ........................................................ 708/420
See application file for complete search history.

(56) References Cited

U.S. PATENT DOCUMENTS 4,673,941 A   6/1987 Van Der Mark
5,381,357 A * 1/1995 Wedgwood et al. .......... 708/319
(Continued)

*Primary Examiner* — Tan V. Mai
(74) *Attorney, Agent, or Firm* — Nicholson De Vos Webster & Elliott LLP

(57) ABSTRACT

A vector processor is provided having an instruction set with a vector convolution function. The disclosed vector processor performs a convolution function between an input signal and a filter impulse response by obtaining a vector comprised of at least N1+N2−1 input samples; obtaining N2 time shifted versions of the vector (including a zero shifted version), wherein each time shifted version comprises N1 samples; and performing a weighted sum of the time shifted versions of the vector by a vector of N1 coefficients; and producing an output vector comprising one output value for each of the weighted sums. The vector processor performs the method, for example, in response to one or more vector convolution software instructions having a vector input. The vector can comprise a plurality of real or complex input samples and the filter impulse response can be expressed using a plurality of coefficients that are real or complex.

11 Claims, 3 Drawing Sheets

(51) Int. Cl.
*H04B 1/04* (2006.01)
*H04L 1/00* (2006.01)
*H04L 27/233* (2006.01)
*H04B 1/62* (2006.01)
*G06F 9/30* (2006.01)
*H04L 25/02* (2006.01)
*H04L 25/03* (2006.01)
*H03M 3/00* (2006.01)
*H03F 1/02* (2006.01)
*H03F 1/32* (2006.01)
*H03F 3/189* (2006.01)
*H03F 3/24* (2006.01)
*H04B 1/00* (2006.01)

(52) U.S. Cl.
CPC ......... *H04L 25/02* (2013.01); *H04L 25/03178* (2013.01); *H04L 25/03216* (2013.01); *H04L 27/2334* (2013.01); *H03F 2200/336* (2013.01); *H03F 2201/3209* (2013.01); *H03F 2201/3212* (2013.01); *H03F 2201/3224* (2013.01); *H03F 2201/3233* (2013.01); *H04B 1/0003* (2013.01)

(56) References Cited

U.S. PATENT DOCUMENTS

| | | |
|---|---|---|
| 6,150,976 A | 11/2000 | Cooley |
| 6,163,788 A | 12/2000 | Chen et al. |
| 7,895,252 B2 | 2/2011 | Sazegari et al. |
| 2008/0074155 A1 | 3/2008 | Jaklitsch |
| 2009/0285335 A1 | 11/2009 | Hoshuyama |

\* cited by examiner

VECTOR PROCESSOR HAVING INSTRUCTION SET WITH VECTOR CONVOLUTION FUNCTION FOR FIR FILTERING

CROSS-REFERENCE TO RELATED APPLICATIONS

The present application claims priority to U.S. Patent Provisional Application Ser. No. 61/552,242, filed Oct. 27, 2011, entitled "Software Digital Front End (SoftDFE) Signal Processing and Digital Radio," incorporated by reference herein. The present application is related to U.S. patent application Ser. No. 12/849142, filed Aug. 3, 2010, entitled "System and Method for Providing Memory Bandwidth Efficient Correlation Acceleration," incorporated by reference herein.

FIELD OF THE INVENTION

The present invention is related to digital processing techniques and, more particularly, to techniques for vector convolution.

BACKGROUND OF THE INVENTION

A vector processor implements an instruction set containing instructions that operate on vectors (i.e., one-dimensional arrays of data). Scalar digital signal processors (DSPs), on the other hand, have instructions that operate on single data items. Vector processors offer improved performance on certain workloads.

Digital processors, such as DSPs and vector processors, often incorporate specialized hardware to perform software operations that are required for math-intensive processing applications, such as addition, multiplication, multiply-accumulate (MAC), and shift-accumulate. A Multiply-Accumulate architecture, for example, recognizes that many common data processing operations involve multiplying two numbers together, adding the resulting value to another value and then accumulating the result. Such basic operations can be efficiently carried out utilizing specialized high-speed multipliers and accumulators.

Existing DSPs and vector processors, however, do not provide specialized instructions to support vector convolution of an input signal by a filter having an impulse response. Increasingly, however, there is a need for vector convolution operations in processors. In the FIR filter domain, for example, convolution processes an input waveform signal and the impulse response of the filter as a function of an applied time lag (delay). A convolution processor typically receives and processes a time shifted input signal and the impulse response of the filter and produces one output value for each time shifted version (each time lag). Such convolution computation can be extensively utilized, for example, in FIR filter applications. For an input sequence length of L and a number of time lags W, the required computation complexity is $O(L*W)$. Because of the large number of calculations required, it is therefore highly desirable to accelerate convolution computation in many applications.

A need therefore exists for digital processors, such as vector processors, having an instruction set that supports a vector convolution function.

SUMMARY OF THE INVENTION

Generally, a vector processor is provided having an instruction set with a vector convolution function. According to one aspect of the invention, the disclosed vector processor performs a convolution function between an input signal and a filter impulse response by obtaining a vector comprised of at least $N1+N2-1$ input samples; obtaining $N2$ time shifted versions of the vector (including a zero shifted version), wherein each time shifted version comprises $N1$ samples; and performing a weighted sum of the time shifted versions of the vector by a vector of $N1$ coefficients; and producing an output vector comprising one output value for each of the weighted sums. The vector processor performs the method, for example, in response to one or more vector convolution software instructions having a vector comprised of the $N1+N2-1$ input samples.

The vector can comprise a plurality of real or complex input samples and the filter impulse response can be expressed using a plurality of coefficients that are real or complex. The plurality of coefficients can be processed with a reduced number of bits using a plurality of iterations until all bits of the coefficients are processed; and an output of each iteration is shifted and accumulated until all bits of the coefficients are processed.

In a further embodiment, when a number of coefficients supported by the convolution is less than a number of coefficients in a filter being processed; smaller chunks of the larger filter are iteratively processed and an output of each iteration is accumulated for each chunk until all of the larger filter is processed.

A more complete understanding of the present invention, as well as further features and advantages of the present invention, will be obtained by reference to the following detailed description and drawings.

DETAILED DESCRIPTION

Aspects of the present invention provide a vector processor that supports a vector convolution function. A convolution instruction typically receives and processes a time shifted input signal and the impulse response of the filter and produces a vector having one output value for each time shifted version. The elementary MAC operations can be with complex or real inputs and coefficients. Thus, both the input samples and coefficients can be real and/or imaginary numbers. The disclosed specialized vector convolution instruction can be used to implement, for example, a channel filter, RF equalizer, IQ imbalance correction and convolutions for digital pre-distortion (DPD) parameter estimation, in Digital Front-end signal processing. As used herein, the term "vector processor" shall be a processor that executes vector instructions on vector data in program code.

The present invention can be applied, for example, in handsets, base stations and other network elements.

Figure 1:
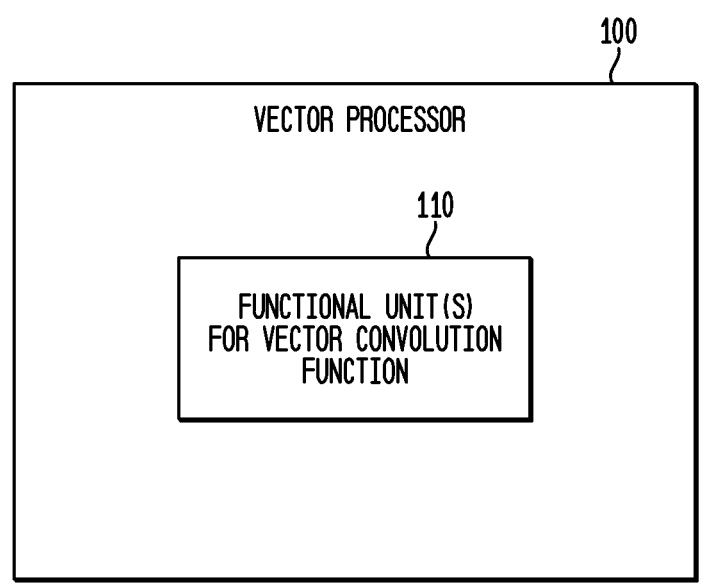
FIG. 1 is a schematic block diagram of an exemplary vector processor that incorporates features of the present invention.

FIG. 1 is a schematic block diagram of an exemplary vector processor 100 that incorporates features of the present invention. As shown in FIG. 1, the exemplary vector processor 100 includes one or more functional units 110 for vector convolution functions, as discussed further below.

Generally, if the vector processor 100 is processing software code that includes a predefined instruction keyword corresponding to a vector convolution function and the appropriate operands for the function (i.e., the input samples), the instruction decoder must trigger the appropriate vector convolution functional unit(s) 110 that is required to process the vector convolution instruction. It is noted that a vector convolution functional unit 110 can be shared by more than one instruction.

Generally, aspects of the present invention extend conventional vector processors to provide an enhanced instruction set that supports vector convolution functions. The vector processor 100 in accordance with aspects of the present invention receives an input vector having real or complex inputs, applies a complex vector convolution function to the input and generates a vector having one output value for each time shift.

The disclosed vector processors 100 have a vector architecture, as discussed hereinafter in conjunction with FIG. 3, that processes one or more vector inputs each comprised of a plurality of real or complex scalar numbers that are processed in parallel.

As discussed further below in conjunction with FIG. 2, if the number of input samples is N1+N2-1, and the number of output samples is N2, the convolution instruction performs N1×N2 convolution operations of, e.g., 1-4 bits in a single cycle. Additionally, if the coefficients for convolution have more bits than the vector convolution functional unit coefficient bits, then the output results can be obtained iteratively. For instance, if the convolutions are implemented by 2 bit coefficients, and 12 bits are needed, it would take 6 iterations to obtain the final result. Assuming 64 samples (63 are used) at the input, and 32 coefficients stored in a register and 32 outputs computed, this instruction performs 1024 two bit coefficient multiplied by 32-bit complex data (16bit real+16bit imaginary) MAC operations in a single cycle and 32-bit complex data (16bit real+16bit imaginary) multiplied by 24-bit complex coefficients (12bit real+12bit imaginary) complex operations in 6 cycles. This performance is orders of magnitude higher than that of general purpose DSPs.

Figure 2:
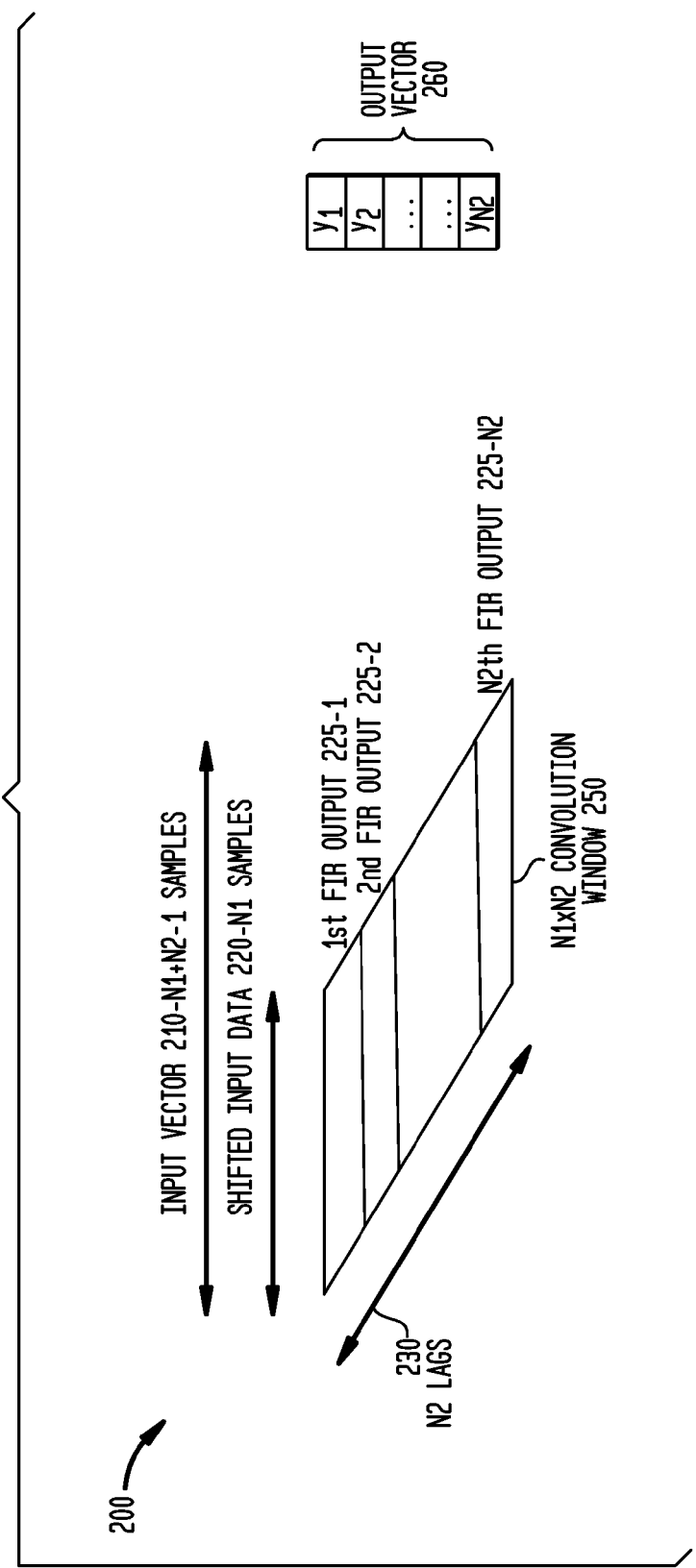
FIG. 2 illustrates a complex vector convolution function that incorporates features of the present invention.

FIG. 2 illustrates a vector convolution function 200 that incorporates features of the present invention. Generally, a vector convolution function 200 computes the convolution of N-bit complex data (N/2-bit real and N/2-bit imaginary) and complex antipodal data (e.g., coefficients). The vector convolution function 200 typically receives an input vector of N1+N2-1 samples and processes time shifted versions 220 of N1 samples of the input vector 210 N1 (along an axis 230) and coefficients, and for each time shifted-version (each time lag) produces an FIR output value 225. An output vector 260 is comprised of the N2 output values.

In the exemplary embodiment of FIG. 2, the input vector 210 comprises N1+N2-1 samples of real or complex data (e.g., 32-bit real and 32-bit imaginary) and there N2 time shifted versions 220 having N1 samples (16-bit real and 16-bit imaginary) that get convoluted with the coefficients. The coefficients can each be binary values (e.g., or 2bit, 4bit, etc).

The disclosed vector convolution function (vec_conv( )) accelerates the FIR filter within the vector convolution function 200 where the coefficients are, e.g., binary values (such as 2bit, 4bit, etc.). Additionally, the operation can be further accelerated and performed in a single cycle using a sufficient number of bits for the coefficient, such as 18 bits. Generally, each time shifted operation comprises an FIR filtering of the shifted input value 220 and the coefficient.

For an exemplary convolution with 2bit values, an FIR filter/convolution operation can be written as follows:

$$y(n) = \sum_{k=0}^{N-1} h(k)x(n-k)$$

$$h(k) = \sum_{j=0}^{N_b-1} (h'_{j,k} + 2h''_{j,k}) \cdot 4^j$$

where:

$$h'_{j,k} \in \{0, 1\}$$

and $$h''_{j,k} \in \{0, 1\}$$

$$y(n) = \sum_{j=0}^{N_b-1} 4^j \left( \sum_{k=0}^{N-1} (h'_{j,k} + 2h''_{j,k}) \cdot x(n-k) \right)$$

where h(k) indicates the coefficients and x(n-k) indicates the time shifted input values. In the case of a multi-phase filter, the coefficients $h_k$ can be changed for each phase of the filter.

The convolution of an input signal x by a filter having an impulse response h can be written as follows:

$$y_n = \sum_{k=1}^{Ntaps} h_k x_{n-k}$$

The correlation or cross-correlation of an input signal x with an input signal y can be written as follows (where signal x and/or signal y can be a known reference signal such as a pilot signal or a CDMA binary/bipodal code):

$$c_n = \sum_{k=1}^{N} x_k y_{n+k}$$

For an exemplary convolution with a 12-bit representation of the coefficients, there are 6 iterations to compute the FIR filter output (6 times 2-bit values).

Figure 3:
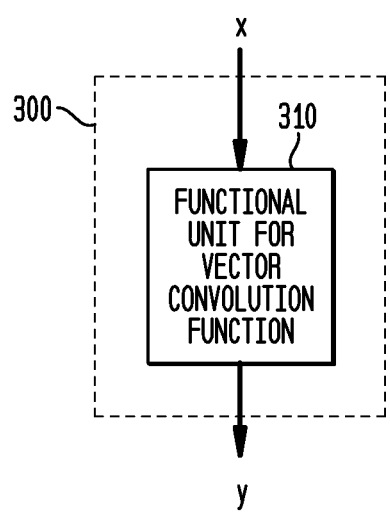
FIG. 3 is a schematic block diagram of an exemplary vector-based digital processor that processes a vector input in accordance with an embodiment of the present invention to produce a vector output.

FIG. 3 is a schematic block diagram of an exemplary vector-based digital processor 300 that processes one or more complex numbers simultaneously in accordance with an embodiment of the present invention. Generally, the vector-based implementation of FIG. 3 decreases complexity or the number of cycles needed to implement the algorithm, relative to a scalar implementation, by performing different processes concurrently. Thus, the vector-based digital processor 300 contains a functional unit 310 for vector convolution.

Generally, the vector-based digital processor 300 processes a vector of inputs x and generates a vector of outputs, y(n). An exemplary vector-based digital processor 300 for N1=32 and N2=37 can be expressed as:

$$(y1, y2, \ldots y37) = \text{vec\_cor32} \times 37(x1, x2, \ldots, x68).$$

CONCLUSION

While exemplary embodiments of the present invention have been described with respect to digital logic blocks and memory tables within a digital processor, as would be apparent to one skilled in the art, various functions may be implemented in the digital domain as processing steps in a software program, in hardware by circuit elements or state machines, or in combination of both software and hardware. Such software may be employed in, for example, a digital signal processor, application specific integrated circuit or micro-controller. Such hardware and software may be embodied within circuits implemented within an integrated circuit.

Thus, the functions of the present invention can be embodied in the form of methods and apparatuses for practicing those methods. One or more aspects of the present invention can be embodied in the form of program code, for example, whether stored in a storage medium, loaded into and/or executed by a machine, wherein, when the program code is loaded into and executed by a machine, such as a processor, the machine becomes an apparatus for practicing the invention. When implemented on a general-purpose processor, the program code segments combine with the processor to provide a device that operates analogously to specific logic circuits. The invention can also be implemented in one or more of an integrated circuit, a digital processor, a microprocessor, and a micro-controller.

It is to be understood that the embodiments and variations shown and described herein are merely illustrative of the principles of this invention and that various modifications may be implemented by those skilled in the art without departing from the scope and spirit of the invention.

We claim:

1. A method performed by a vector processor for performing an instruction to perform a convolution between an input signal and a filter impulse response, said method comprising:
    obtaining a vector comprised of at least N1+N2-1 input samples;
    obtaining N2 time shifted versions of said vector, wherein each time shifted version comprises N1 samples; and
    performing a weighted sum of said time shifted versions of said vector by a vector of N1 coefficients; and
    producing an output vector comprising one output value for each of said weighted sums, wherein said filter impulse response is expressed using a plurality of coefficients and wherein a number of coefficients supported by said convolution is less than a number of coefficients in a filter; wherein said method further comprises the step of iteratively processing smaller chunks of a larger filter; wherein an output of each iteration is accumulated for each chunk until all of said larger filter is processed.

2. The method of claim 1, wherein said N2 time shifted versions of said vector includes a zero shifted version of said vector.

3. The method of claim 1, wherein said method is performed by a vector processor in response to one or more vector convolution software instructions having a vector comprised of said N1+N2-1 input samples.

4. The method of claim 1, wherein said vector processor executes software instructions from program code.

5. The method of claim 1, wherein said vector comprises a plurality of real or complex input samples and said filter impulse response is expressed using a plurality of coefficients that are real or complex.

6. The method of claim 1, wherein said filter impulse response is expressed using a plurality of coefficients and wherein said coefficients are processed with a reduced number of bits using a plurality of iterations until all bits of said coefficients are processed; wherein an output of each iteration is shifted and accumulated until all bits of said coefficients are processed.

7. A vector processor that performs a convolution between an input signal and a filter impulse response, comprising:
    a memory; and
    at least one hardware device, coupled to the memory, operative to execute a single decoded instruction stored in memory to:
        obtain a vector comprised of at least N1+N2-1 input samples;
        obtain N2 time shifted versions of said vector, wherein each time shifted version comprises N1 samples; and
        perform a weighted sum of said time shifted versions of said vector by a vector of N1 coefficients; and
        produce an output vector comprising one output value for each of said weighted sums, wherein said filter impulse response is expressed using a plurality of coefficients and wherein a number of coefficients supported by said convolution is less than a number of coefficients in a filter; wherein smaller chunks of a larger filter are iteratively processed and an output of each iteration is accumulated for each chunk until all of said larger filter is processed.

8. The vector processor of claim 7, wherein vector processor performs said convolution in response to one convolution software instruction having a vector comprised of said N1+N2-1 input samples.

9. The vector processor of claim 7, wherein said vector processor executes software instructions from program code.

10. The vector processor of claim 7, wherein said vector comprises a plurality of real or complex input samples and said filter impulse response is expressed using a plurality of coefficients that are real or complex.

11. The vector processor of claim 7, wherein said filter impulse response is expressed using a plurality of coefficients and wherein said coefficients are processed with a reduced number of bits using a plurality of iterations until all bits of said coefficients are processed; wherein an output of each iteration is shifted and accumulated until all bits of said coefficients are processed.

* * * * *